US010262860B2

(12) United States Patent
Yan et al.

(10) Patent No.: US 10,262,860 B2
(45) Date of Patent: Apr. 16, 2019

(54) METHOD OF FABRICATING ELECTRODES, METHOD OF FABRICATING THIN FILM TRANSISTOR, METHOD OF FABRICATING ARRAY SUBSTRATE, THIN FILM TRANSISTOR, ARRAY SUBSTRATE, AND DISPLAY APPARATUS

(71) Applicants: BOE TECHNOLOGY GROUP CO., LTD., Beijing (CN); South China University of Technology, Guangzhou, Guangdong (CN)

(72) Inventors: Liangchen Yan, Beijing (CN); Xiaoguang Xu, Beijing (CN); Linfeng Lan, Beijing (CN); Lei Wang, Beijing (CN); Junbiao Peng, Beijing (CN)

(73) Assignees: BOE TECHNOLOGY GROUP CO., LTD., Beijing (CN); South China University of Technology, Guangzhou, Guangdong (CN)

( * ) Notice: Subject to any disclaimer, the term of this patent is extended or adjusted under 35 U.S.C. 154(b) by 0 days.

(21) Appl. No.: 15/741,737

(22) PCT Filed: Jun. 30, 2017

(86) PCT No.: PCT/CN2017/091131
§ 371 (c)(1),
(2) Date: Jan. 3, 2018

(87) PCT Pub. No.: WO2018/082327
PCT Pub. Date: May 11, 2018

(65) Prior Publication Data
US 2018/0337201 A1    Nov. 22, 2018

(30) Foreign Application Priority Data

Nov. 1, 2016    (CN) .......................... 2016 1 0936120

(51) Int. Cl.
*H01L 21/027* (2006.01)
*H01L 21/02* (2006.01)
(Continued)

(52) U.S. Cl.
CPC ........ *H01L 21/0273* (2013.01); *H01L 21/027* (2013.01); *H01L 21/0212* (2013.01);
(Continued)

(58) Field of Classification Search
CPC ......... H01L 21/02107; H01L 21/02109; H01L 21/02112; H01L 21/02118; H01L 21/0212;
(Continued)

(56) References Cited

U.S. PATENT DOCUMENTS 5,223,454 A * 6/1993 Uda .................... H01L 23/3121
148/DIG. 100
6,838,361 B2 * 1/2005 Takeo ................. H01L 51/0005
438/151
(Continued)

FOREIGN PATENT DOCUMENTS

| CN | 102222770 A | 10/2011 |
|---|---|---|
| JP | 2015005568 A | 1/2015 |
| WO | 2014162287 A2 | 12/2014 |

OTHER PUBLICATIONS

International Search Report & Written Opinion dated Oct. 19, 2017, regarding PCT/CN2017/091131.
(Continued)

*Primary Examiner* — Eduardo A Rodela
(74) *Attorney, Agent, or Firm* — Intellectual Valley Law, P.C.

(57) ABSTRACT

The present application discloses a method of fabricating a plurality of electrodes. The method includes forming a hydrophobic pattern containing a hydrophobic material on a
(Continued)

base substrate, the hydrophobic pattern has a first ridge on a first edge of the hydrophobic pattern, the hydrophobic pattern has a thickness at the first ridge greater than that in a region outside a region corresponding to the first ridge; removing a portion of the hydrophobic pattern outside the region corresponding to the first ridge; and forming a first electrode on a first side of the first ridge and a second electrode on a second side of the first ridge.

20 Claims, 9 Drawing Sheets

(51) Int. Cl.
    *H01L 29/417*     (2006.01)
    *H01L 27/12*     (2006.01)
    *H01L 21/28*     (2006.01)
    *H01L 29/423*     (2006.01)
    *H01L 29/66*     (2006.01)
    *H01L 29/786*     (2006.01)

(52) U.S. Cl.
    CPC .... *H01L 21/0272* (2013.01); *H01L 21/02107* (2013.01); *H01L 21/02109* (2013.01); *H01L 21/02112* (2013.01); *H01L 21/02118* (2013.01); *H01L 21/02642* (2013.01); *H01L 21/28* (2013.01); *H01L 27/124* (2013.01); *H01L 27/1262* (2013.01); *H01L 27/1292* (2013.01); *H01L 29/41733* (2013.01); *H01L 29/42384* (2013.01); *H01L 29/66742* (2013.01); *H01L 29/786* (2013.01); *H01L 29/7869* (2013.01)

(58) Field of Classification Search
    CPC ......... H01L 2224/8085; H01L 2924/07; H01L 2924/07025; H01L 21/02642; H01L 21/0272; H01L 21/0273; H01L 21/0332; H01L 21/0334; H01L 21/0335; H01L 21/0337; H01L 21/768; H01L 21/76811; H01L 21/7688; H01L 27/1288; H01L 27/3283; H01L 27/3297; H01L 51/0011; H01L 51/0014; H01L 51/0015; H01L 51/0017; H01L 51/0019; H01L 2224/0347; H01L 2224/03472; H01L 2224/03474; H01L 2224/0348; H01L 2224/03902; H01L 2224/03903; H01L 2224/03906; H01L 2224/1147; H01L 2224/11472; H01L 2224/11474; H01L 2224/1148; H01L 2224/11902; H01L 2224/11903; H01L 2224/11906; H01L 2224/11912; H01L 2224/2747; H01L 2224/27472; H01L 2224/27474; H01L 2224/27902; H01L 2224/27903; H01L 2224/27906

See application file for complete search history.

(56) References Cited

U.S. PATENT DOCUMENTS

| | | |
|---|---|---|
| 2004/0029382 A1* | 2/2004 | Kawase .............. H01L 51/0005 438/689 |
| 2006/0040435 A1 | 2/2006 | Morisue et al. |
| 2007/0138018 A1* | 6/2007 | Choi .................... G03G 15/348 205/127 |
| 2009/0101944 A1 | 4/2009 | Takasu |
| 2009/0230385 A1* | 9/2009 | Jang .................... H01L 51/0545 257/40 |

OTHER PUBLICATIONS

H. Sirringhaus et al., "High-Resolution Inkjet Printing of All-Polymer Transistor Circuits", Science, vol. 290, 2123-2126, Dec. 15, 2000.

\* cited by examiner

METHOD OF FABRICATING ELECTRODES, METHOD OF FABRICATING THIN FILM TRANSISTOR, METHOD OF FABRICATING ARRAY SUBSTRATE, THIN FILM TRANSISTOR, ARRAY SUBSTRATE, AND DISPLAY APPARATUS

CROSS-REFERENCE TO RELATED APPLICATION

This application is a national stage application under 35 U.S.C. § 371 of International Application No. PCT/CN2017/091131, filed Jun. 30, 2017, which claims priority to Chinese Patent Application No. 201610936120.1, filed Nov. 1, 2016, the contents of which are incorporated by reference in the entirety.

TECHNICAL FIELD

The present invention relates to display technology, more particularly, a method of fabricating a plurality of electrodes, a method of fabricating a thin film transistor, a method of fabricating an array substrate, a thin film transistor, an array substrate, and a display apparatus.

BACKGROUND

Display apparatuses such as liquid crystal display (LCD) apparatuses and organic light-emitting diode (OLED) display apparatuses have been widely used. LCD and OLED display devices use thin film transistor (TFT) to control pixels in the display panel. Examples of TFT include amorphous silicon TFT, polycrystalline silicone TFT, single crystal silicon TFT, metal oxide TFT, as well as organic semiconductor TFT.

SUMMARY

In one aspect, the present invention provides a method of fabricating a plurality of electrodes, comprising forming a hydrophobic pattern comprising a hydrophobic material on a base substrate, the hydrophobic pattern has a first ridge on a first edge of the hydrophobic pattern the hydrophobic pattern has a thickness at the first ridge greater than that in a region outside a region corresponding to the first ridge; removing a portion of the hydrophobic pattern outside the region corresponding to the first ridge; and forming a first electrode on a first side of the first ridge and a second electrode on a second side of the first ridge.

Optionally, forming the hydrophobic pattern on the base substrate comprises ink-jet printing an ink comprising the hydrophobic material on the base substrate; and drying the ink comprising the hydrophobic material; wherein the hydrophobic pattern having the first ridge is formed by a coffee-ring effect.

Optionally, forming the first electrode and the second electrode comprises ink-jet printing an ink comprising a conductive material on the first ridge; wherein the ink comprising the conductive material de-wets the first ridge, thereby being at least partially repelled to two sides of the first ridge.

Optionally, the method further comprises annealing the base substrate having the ink comprising the conductive material ink-jet printed, thereby drying the ink comprising the conductive material.

Optionally, removing the portion of the hydrophobic pattern outside the region corresponding to the first ridge comprises treating the hydrophobic pattern with a plasma; and, subsequent to treating the hydrophobic pattern with the plasma, annealing the base substrate having the hydrophobic pattern.

Optionally, the plasma comprises oxygen.

Optionally, treating the hydrophobic pattern with the plasma is performed for a duration in a range of approximately 3 minutes to approximately 15 minutes, with a power in a range of approximately 30 Watts to approximately 100 Watts.

Optionally, annealing the base substrate having the hydrophobic pattern is performed at a temperature in a range of approximately 80 degrees to approximately 150 degrees for a duration in a range of approximately 5 minutes to approximately 20 minutes.

Optionally, the method further comprises removing the first ridge.

Optionally, removing the first ridge comprises dissolving the first ridge using a solvent.

Optionally, subsequent to removing the portion of the hydrophobic pattern outside the region corresponding to the first ridge, the first ridge has a width greater than zero and less than approximately 10 microns.

Optionally, prior to removing the portion of the hydrophobic pattern outside the region corresponding to the first ridge, the hydrophobic pattern has a width greater than approximately 10 microns, and the first ridge has a height greater than approximately 10 nm; and subsequent to removing the portion of the hydrophobic pattern outside the region corresponding to the first ridge, the first ridge has a height greater than 5 nm.

Optionally, the hydrophobic pattern has a plurality of ridges including the first ridge on the first edge of the hydrophobic pattern and a second ridge on a second edge of the hydrophobic pattern opposite to the first edge; removing the portion of the hydrophobic pattern outside the region corresponding to the first ridge comprises removing a portion of the hydrophobic pattern between the first ridge and the second ridge; the method further comprises forming a third electrode on a first side of the second ridge and a fourth electrode on a second side of the second ridge; and removing the second ridge.

Optionally, the hydrophobic material comprises a perfluoro resin.

In another aspect, the present invention provides a method of fabricating a thin film transistor, comprising forming the first electrode and the second electrode according to the method described herein, the first electrode and the second electrode are respectively a source electrode and a drain electrode of the thin film transistor.

In another aspect, the present invention provides a thin film transistor fabricated by the method described herein.

In another aspect, the present invention provides a display apparatus comprising the thin film transistor described herein or fabricated by the method described herein.

In another aspect, the present invention provides a method of fabricating an array substrate, comprising forming a hydrophobic material layer comprising a plurality of hydrophobic sections on a base substrate; each of the plurality of hydrophobic sections is formed to have a first ridge on a first edge, each of the plurality of hydrophobic sections has a thickness at the first ridge greater than that in a region outside a region corresponding to the first ridge; removing a portion of each of the plurality of hydrophobic sections outside a region corresponding to the first ridge; and forming a plurality of source electrodes and a plurality of drain electrodes on the base substrate, each pair of one of the plurality of source electrodes one of the plurality of drain electrodes are formed on two opposite sides of the first ridge.

In another aspect, the present invention provides an array substrate fabricated by the method described herein.

In another aspect, the present invention provides a display apparatus comprising the array substrate described herein or fabricated by the method described herein.

BRIEF DESCRIPTION OF THE FIGURES

The following drawings are merely examples for illustrative purposes according to various disclosed embodiments and am not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional methods, fabrication of short-channel thin film transistor typically involves a highly complicated lithography process such as a photolithography process, an ion beam lithography process, or an electron beam lithography process. This requirement makes the fabrication art the short-channel thin film transistor a very costly, highly complicated, low efficient process. Moreover, a large-scale fabrication is not possible using the conventional methods.

Figure 1:
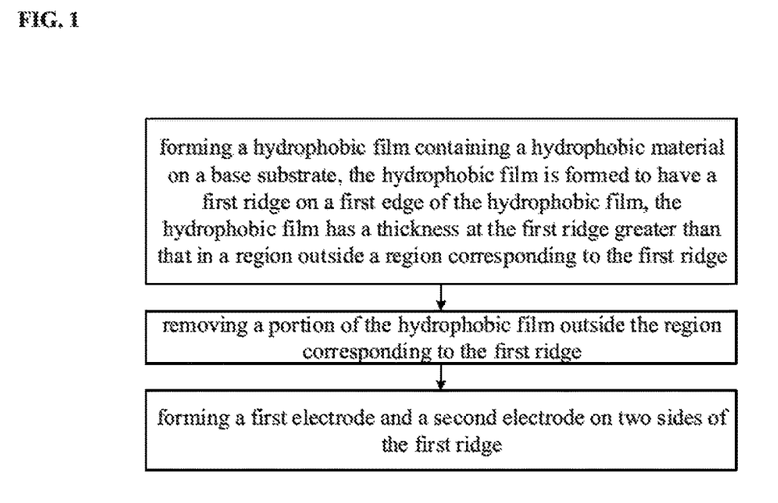
FIG. 1 is a flow chart illustrating a method of fabricating a plurality of electrodes in some embodiments according to the present disclosure.

Accordingly, the present disclosure provides, inter alia, a method of fabricating a plurality of electrodes, a method of fabricating a thin film transistor, a method of fabricating an array substrate, a thin film transistor, an array substrate, and a display apparatus that substantially obviate one or more of the problems due to limitations and disadvantages of the related art. In one aspect, the present disclosure provides a method of fabricating a plurality of electrodes. FIG. 1 is a flow chart illustrating a method of fabricating a plurality of electrodes in some embodiments according to the present disclosure. Referring to FIG. 1, the method in some embodiments includes forming a hydrophobic pattern containing a hydrophobic material on a base substrate, the hydrophobic pattern is formed to have a first ridge on a first edge of the hydrophobic pattern, the hydrophobic pattern has a thickness at the first ridge greater than that in a region outside a region corresponding to the first ridge; removing a portion of the hydrophobic pattern outside the region corresponding to the first ridge; and forming a first electrode on a first side of the first ridge and a second electrode respectively on a second side of the first ridge, the second side opposite to the first side. Optionally, the portion of the hydrophobic pattern outside the region corresponding to the first ridge is removed but the first ridge remains.

In some embodiments, the step of forming the hydrophobic pattern on the base substrate is performed by ink-jet printing an ink containing the hydrophobic material on the base substrate; and drying the ink containing the hydrophobic material. Optionally, the hydrophobic pattern having the first ridge is formed by a coffee-ring effect in the ink. The coffee-ring effect refers to a phenomenon in which fluid flow in which a solvent of the solution produced in a regular pattern by printing or various methods flows from a center of the solution toward an edge thereof due to a non-uniform evaporation rate of the solvent on a surface of the solution occurs, and thus a solute in the solution is thickly layered at an edge of a solution droplet to be formed in a ring shape. The physical mechanism underlying the occurrence of the coffee-ring effect is due to the pinning of the contact line and the spatially non-uniform evaporation rate of the liquid. It has been suggested that the pattern is due to capillary flow induced by different evaporation rates across the drop. More specifically, liquid evaporating from the edge of the drop is replenished by liquid from the interior of the drop. The flow toward the edge can carry significant amount of the dispersed material to the edge. Liquid is dried from the outer surface or an edge of a discharged liquid. A portion of the discharged liquid positioned at the middle flows toward the edge thereof by capillary flow. In more detail, liquid tends to maintain a spherical shape due to surface tension. When an edge portion is evaporated first in the discharged liquid, while the portion of the liquid at the middle flows toward the edge, the liquid tends to maintain a shape as close to the original shape as possible. In the context of the present disclosure, the ink containing the hydrophobic material is ink-jet printed on the base substrate, and the drying of the ink includes evaporation of the solvent in the ink to redistribute the hydrophobic material in the ink according to the coffee ring effect, thereby inducing a higher concentration of the hydrophobic material at the edges (e.g., one or more of the first edge and the second edge) of the ink-jet printed hydrophobic pattern (e.g., a strip) and a sparse distribution of the hydrophobic material between the edges.

In some embodiments, the step of forming the first electrode and the second electrode respectively on two sides of the first ridge includes ink-jet printing an ink containing a conductive material on the first ridge. The ink containing the conductive material and the hydrophobic material are selected so that the ink containing the conductive material de-wets the first ridge, thereby being at least partially repelled to two sides of the first ridge. The ink containing the conductive material is subsequently dried, thereby forming the first electrode and the second electrode. Optionally, the ink containing the conductive material may be ink-jet printed on the second ridge, the ink containing the conductive material and the hydrophobic material are selected so that the ink containing the conductive material de-wets the second ridge, thereby being at least partially repelled to two sides of the second ridge. The ink containing the conductive material is subsequently dried, thereby forming the third electrode and the fourth electrode.

By first forming the hydrophobic first ridge (e.g., by the coffee-ring effect) and forming the first electrode and the second electrode by de-wetting the hydrophobic first ridge using an ink containing the conductive material, the electrodes may be formed without a lithography process such as a photolithography process, an ion beam lithography process, or an electron beam lithography process. The fabrication costs can be significantly lowered. Moreover, a large-scale electrode fabrication process is made possible by the present method. For example, an array of electrodes may be fabricated on a substrate by forming, a hydrophobic material layer having a plurality of hydrophobic sections (e.g., strips or blocks or dots) on a base substrate; each of the plurality of hydrophobic sections is formed to have a first ridge on a first edge of the hydrophobic pattern and a second ridge on a second edge of the hydrophobic pattern opposite to the first edge, each of the plurality of hydrophobic sections has a thickness at the first ridge and the second ridge greater than that in a region between the first ridge and the second ridge; removing a portion of each of the plurality of hydrophobic sections between the first ridge and the second ridge; and forming a plurality of first electrodes and a plurality of second electrodes on the base substrate, each pair of one of the plurality of first electrodes one of the plurality of second electrodes are respectively formed on two opposite sides of the first ridge. Examples of the first electrode and the second electrode include a source electrode and a drain electrode of a thin film transistor. Thus, the large-scale electrode fabrication process described herein may be used for a low-cost, lithography-free, fabrication process of electrodes in an array substrate, which is not possible in conventional methods. Further, the present method is applied for making the source electrode and the drain electrode of a thin film transistor, the width of the first ridge can be controlled to be a small value (e.g., less than approximately 15 microns, less than approximately 10 microns, less than approximately 5 microns, less than approximately 4 microns, or less than approximately 3 microns). Thus, a short-channel thin film transistor can be achieved by the present method.

Optionally, subsequent to removing the portion of the hydrophobic pattern outside the region corresponding to the first ridge, the first ridge has a width greater than zero and less than approximately 20 microns, e.g., less than approximately 15 microns, less than approximately 10 microns, less than approximately 5 microns, less than approximately 4 microns, or less than approximately 3 microns. Optionally, subsequent to removing the portion of the hydrophobic pattern outside the region corresponding to the first ridge, the first ridge has a height greater than 5 nm, e.g., greater than 10 nm, greater than 15 nm, or greater than 20 nm.

Figure 2A:
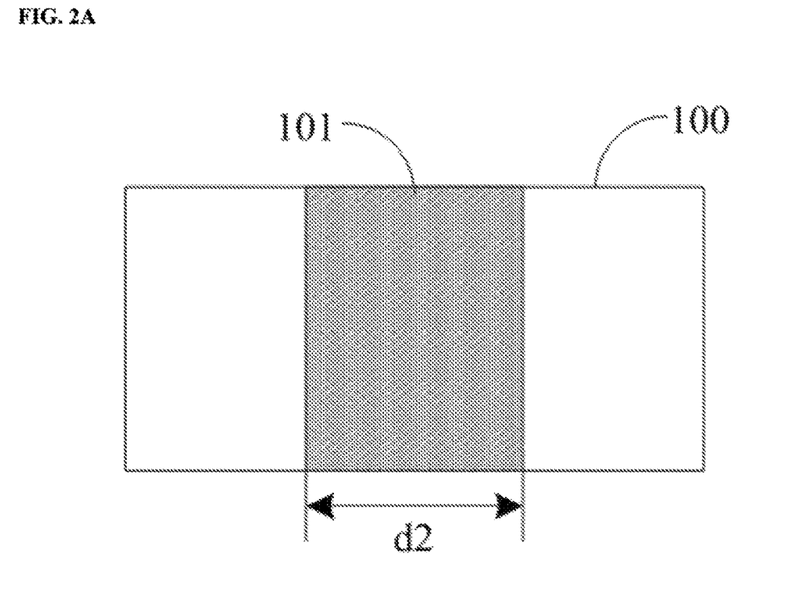
FIG. 2A to 2J illustrate a process of fabricating a plurality of electrodes in some embodiments according to the present disclosure.
Figure 2B:
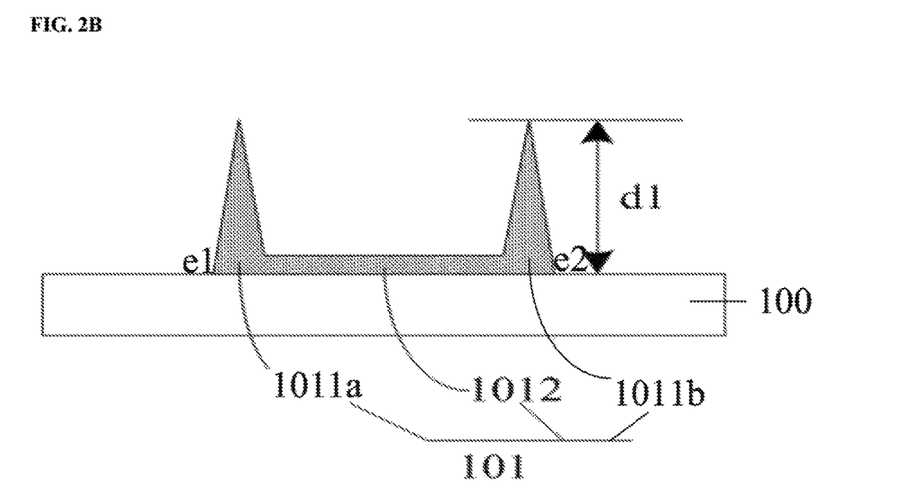

FIG. 2A to 2J illustrate a process of fabricating a plurality of electrodes in some embodiments according to the present disclosure. Referring to FIG. 2A and FIG. 2B, the method in some embodiments includes forming a hydrophobic pattern 101 containing a hydrophobic material on a base substrate 100. For illustration purpose, only one hydrophobic pattern 101 is shown in FIG. 2A and FIG. 2B. Optionally, the method includes forming a plurality of hydrophobic patterns 101 containing a hydrophobic material. Optionally, the hydrophobic pattern 101 is formed by inkjet printing an ink containing the hydrophobic material on the base substrate 100, and drying the ink containing the hydrophobic material. Each, hydrophobic pattern 101 includes a first ridge 1011a on a first edge e1, a second ridge 1011b on a second edge e2 opposite to the first edge e1, and a portion 1012 between the first ridge 1011a and the second ridge 1011b. The hydrophobic pattern 101 has a thickness at the first ridge 1011a and the second ridge 1011b greater than that in a region between the first ridge 1011a and the second ridge 1011b. The base substrate 100 may be made of any appropriate insulating materials such as a glass, silicon dioxide, polyimide, and so on. Optionally, prior to forming the phobic film 101 containing a hydrophobic material on a base substrate 100, other layers (e.g., a semiconductor layer, a dielectric layer, etc.) may be first formed on the base substrate 100.

Any appropriate hydrophobic materials may be used for making the hydrophobic pattern 101. Examples of hydrophobic materials include polymers such as polyimide and polyacrylates. Optionally, the hydrophobic material is a fluoropolymer. Optionally, the hydrophobic material is an amorphous fluoropolymer. Optionally, the hydrophobic material is a crystalline fluoropolymer. Optionally, the hydrophobic material is a perfluoro resin material. Optionally, the hydrophobic material includes CYTOP®.

Referring to FIG. 2A and FIG. 2B, prior to removing the portion 1012 of the hydrophobic pattern 101 between the first ridge 1011a and the second ridge 1011b, the hydrophobic pattern 101 is formed to have a width d2. Optionally, the width d2 is greater than approximately 5 microns, e.g., greater than approximately 10 microns, greater than approximately 15 microns, or greater than approximately 20 microns. Referring to FIG. 2B, prior to removing the portion 1012 of the hydrophobic pattern 101 between the first ridge 1011a and the second ridge 1011b, the first ridge 1011a and the second ridge 1011b are formed (e.g., by the coffee-ring effect) to have a height d1 greater than approximately 10 nm, e.g., greater than approximately 20 nm, greater than approximately 30 nm, greater than approximately 40 nm or greater than approximately 50 nm. Optionally, to ensure that, subsequent to removing the portion 1012 of the hydrophobic pattern 101 between the first ridge 1011a and the second ridge 1011b, the first ridge 1011a and the second ridge 1011b each has a width less than approximately 5 microns, the width d2 of the hydrophobic pattern 101 prior to removing the portion 1012 of the hydrophobic pattern 101 between the first ridge 1011a and the second ridge 1011b is made to be greater than approximately 10 microns. Optionally, to ensure that, subsequent to removing the portion 1012 of the hydrophobic pattern 101 between the first ridge 1011a and the second ridge 1011b, the first ridge 1011a and the second ridge 1011b each, has a height greater than approximately 5 nm, the height d1 of the first ridge 1011a and the second ridge 1011b prior to removing the portion 1012 of the hydrophobic pattern 101 between the first ridge 1011a and the second ridge 1011b is made to be greater than approximately 10 nm. Optionally, the height of the first ridge 1011a and the second ridge 1011b subsequent to removing the portion 1012 of the hydrophobic pattern 101 between the first ridge 1011a and the second ridge 1011b is greater than zero and less than 100 nm, e.g., less than 5 nm.

Figure 2C:
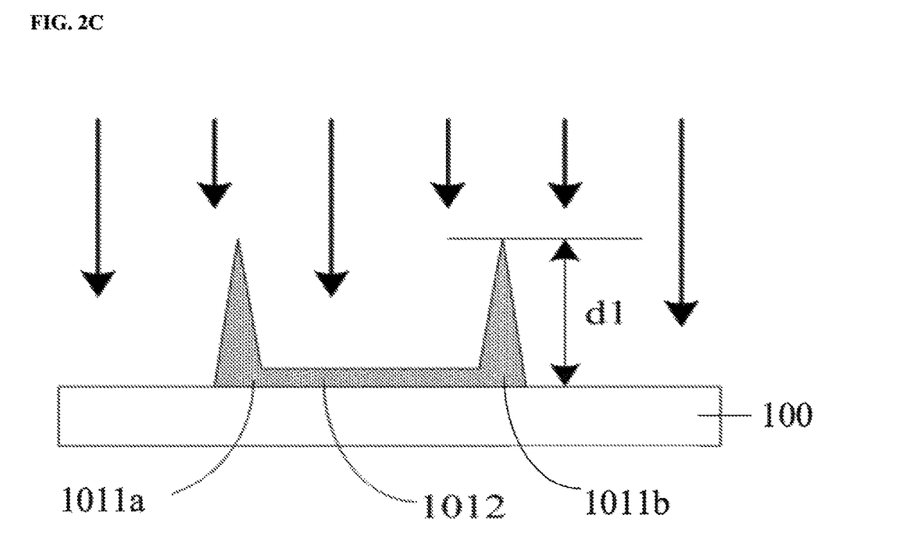
Figure 2D:
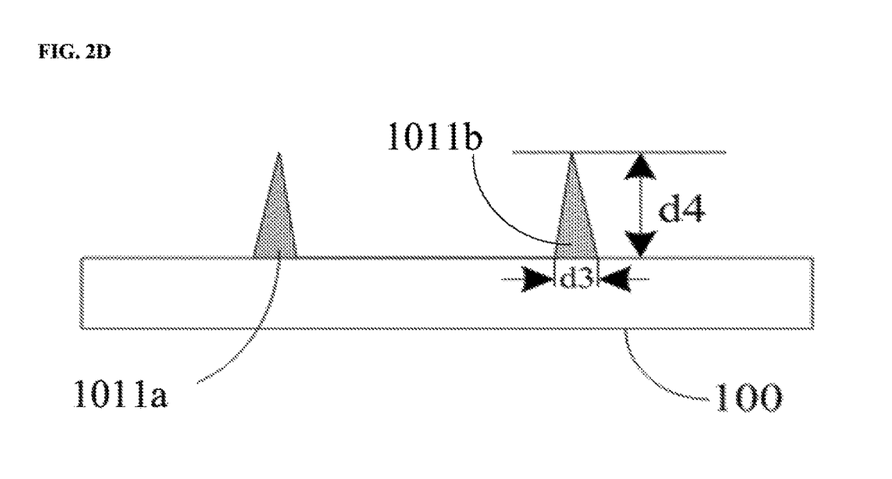

Referring to FIG. 2C and FIG. 2D, the step of removing the portion 1012 of the hydrophobic pattern 101 between the first ridge 1011a and the second ridge 1011b in some embodiments includes treating the hydrophobic pattern 101 with a plasma; and, subsequent to treating the hydrophobic pattern 101 with the plasma, annealing the base substrate 100 having the hydrophobic pattern 101. The arrow in FIG. 2C denotes a direction of the flow of plasma during the plasma treatment. Optionally, the step of removing the portion 1012 of the hydrophobic pattern 101 between the first ridge 1011a and the second ridge 1011b includes etching (e.g., wet etching) the portion 1012 of the hydrophobic pattern 101 between the first ridge 1011a and the second ridge 1011b using an etching agent (e.g., an etching solution).

Optionally, the plasma is a plasma containing oxygen. Optionally, the step of treating the hydrophobic pattern 101 with the plasma is performed for a duration in a range of approximately 1 minutes to approximately 60 minutes, e.g., approximately 1 minutes to approximately 30 minutes, or approximately 3 minutes to approximately 15 minutes. Optionally, the step of treating the hydrophobic pattern 101 with the plasma is performed with a power in a range of approximately 10 Watts to approximately 200 Watts, e.g., approximately 20 Watts to approximately 150 Watts, or approximately 30 Watts to approximately 100 Watts.

By annealing the base substrate 100 having the hydrophobic pattern 101 subsequent to treating the hydrophobic pattern 101 with the plasma, the solvent in the first ridge 1011a (or the second ridge 1011b) can be further removed. The solvent removed first ridge facilitates the de-wetting of the ink containing the conductive material on the first ridge 1011a, repelling the ink to two sides of the first ridge 1011a. Optionally, the step of annealing the base substrate 100 having the hydrophobic pattern 101 is performed at a temperature in a range of approximately 30 degrees to approximately 450 degrees, e.g., approximately 40 degrees to approximately 350 degrees, approximately 50 degrees to approximately 250 degrees, or approximately 80 degrees to approximately 150 degrees. Optionally, the step of annealing the base substrate 100 having the hydrophobic pattern 101 is performed for a duration in a range of approximately 1 minutes to approximately 120 minutes, e.g., approximately 1 minutes to approximately 60 minutes, approximately 5 minutes to approximately 40 minutes, or approximately 5 minutes to approximately 20 minutes.

Optionally, during the plasma treatment of the hydrophobic pattern 101, the first ridge 1011a and the second ridge 1011b can be treated by the plasma together with the portion 1012 of the hydrophobic pattern 101 between the first ridge 1011a and the second ridge 1011b. The first ridge 1011a and the second ridge 1011b are formed to have a sufficiently large height (e.g., greater than 10 nm) prior to the plasma treatment, so that even if some material in the first ridge 1011a and the second ridge 1011b are removed during the plasma treatment, the remaining height of the first ridge 1011a and the second ridge 1011b subsequent to the plasma treatment is still large enough (e.g., greater than 5 nm) for the purpose of forming the first electrode and the second electrode.

Optionally, during the plasma treatment of the hydrophobic pattern 101, the first ridge 1011a and the second ridge 1011b are not treated by the plasma (blocked from the plasma), and only the portion 1012 of the hydrophobic pattern 101 between the first ridge 1011a and the second ridge 1011b is plasma-treated and removed. Optionally, the width d2 of the hydrophobic pattern 101 prior to removing the portion 1012 of the hydrophobic pattern 101 between the first ridge 1011a and the second ridge 1011b is made to be sufficiently large (greater than approximately 10 microns), this ensures that the first ridge 1011a or the second ridge 1011b has a sufficiently small width d3 (e.g., less than approximately 5 microns) subsequent to removing the portion 1012 of the hydrophobic pattern 101 between the first ridge 1011a and the second ridge 1011b.

Figure 2E:
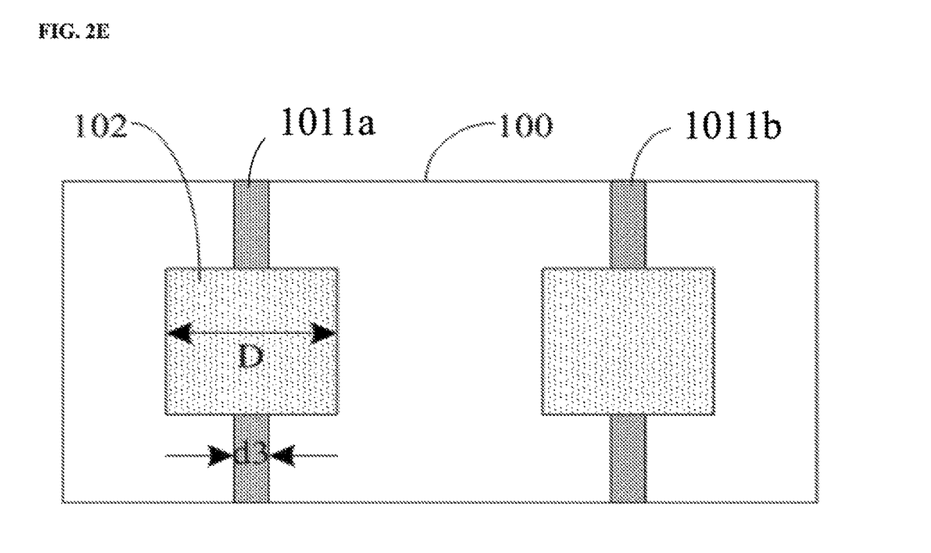
Figure 2F:
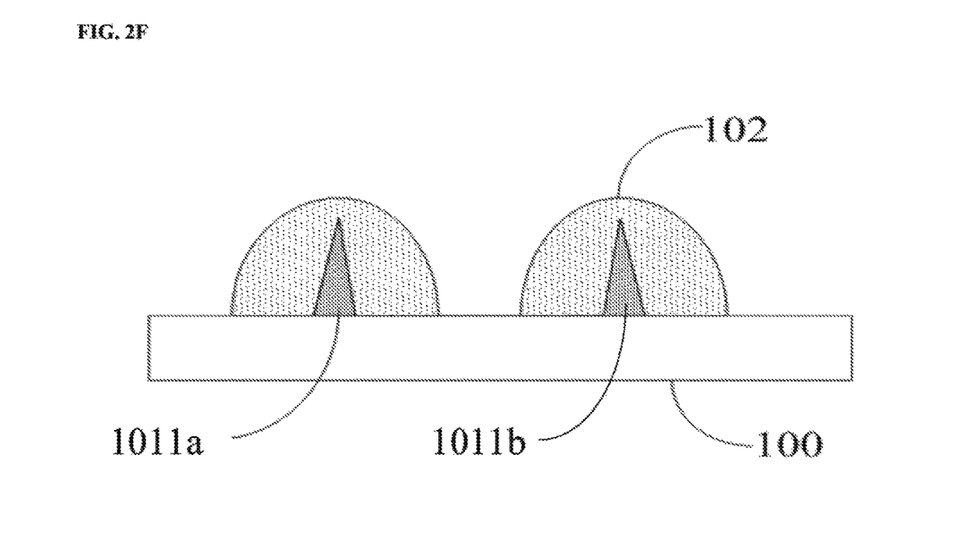

Referring to FIG. 2E and FIG. 2F, the step of forming the first electrode and the second electrode respectively on two opposite sides of the first ridge in some embodiments includes applying (e.g., by ink-jet printing) an ink containing a conductive material 102 (e.g., a conductive material solution) on the first ridge 1011a or on the second ridge 1011b. As shown in FIG. 2E and FIG. 2F, the ink containing a conductive material 102 is applied on the first ridge 1011a to have a width D greater than the width d3 of the first ridge 1011a, a projection of the ink containing a conductive material 102 on the base substrate 100, when applied onto the first ridge 1011a, covers the entire width d3 of the first ridge 1011a.

Various appropriate inks containing the conductive material may be used for making the first electrode and the second electrode. Examples of appropriate inks includes inorganic metal based inks such as an ink containing gold, an ink containing silver, an ink containing copper, and organic based inks, e.g., a conductive polymer solution such as an ink containing poly(3,4-ethylenedioxythiophene) polystyrene sulfonate (PEDOT:PSS). Optionally, the ink containing the conductive material 102 is in a hydrophilic solution.

Figure 2G:
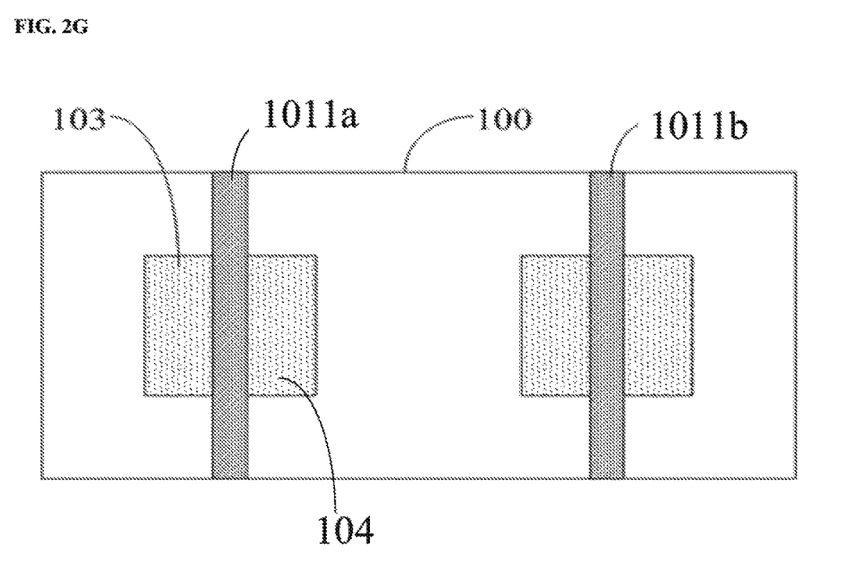
Figure 2H:
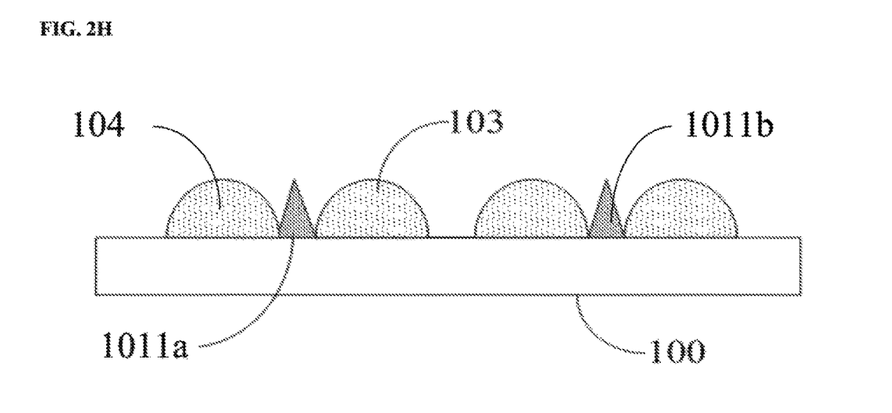

Referring to FIG. 2G and FIG. 2H, due to the hydrophobicity of the first ridge 1011a, the ink containing the conductive material 102 de-wets the first ridge 1011a, and are at least partially repelled to two sides of the first ridge 1011a. The method in some embodiments further includes annealing the base substrate 100 having the ink containing the conductive material ink-jet printed, to dry the ink containing the conductive material, thereby forming a first electrode 103 on a first side of the first ridge 1011a and a second electrode 104 respectively on a second side of the first ridge 1011a. Various appropriate annealing temperature and duration may be used for annealing the base substrate having the ink containing the conductive material inkjet printed, as long as the annealing condition sufficiently allows the removal of solvent in the ink and does not decompose the ink. Alternatively, other appropriate drying methods may be used.

The hydrophobic material of the first ridge 1011a and the material for the base substrate 100 may be selected to have different wettability, and the viscosity, surface energy, and volume of the ink containing the conductive material may be selected, to render the ink containing the conductive material, when applied onto the first ridge 1011a, de-wet the first ridge 1011a, so that the ink containing the conductive material separates into two droplets on two opposite sides of the first ridge 1011a. Optionally, the two droplets may be spaced apart by a gap. Optionally, the gap has a width substantially the same as the width d3 of the first ridge 1011a. The solution properties (e.g., viscosity and surface energy) of the ink containing the conductive material may be adjusted by adjusting the solvent or additives in the ink containing the conductive material.

Figure 2I:
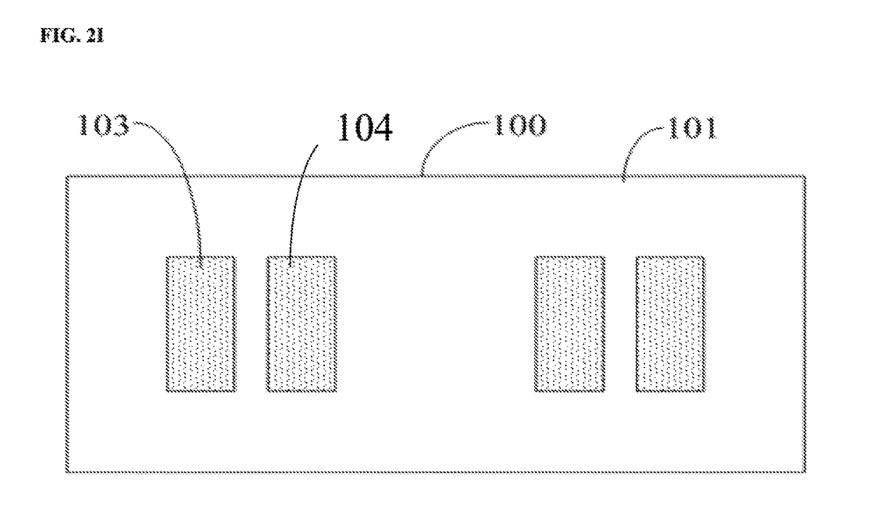
Figure 2J:
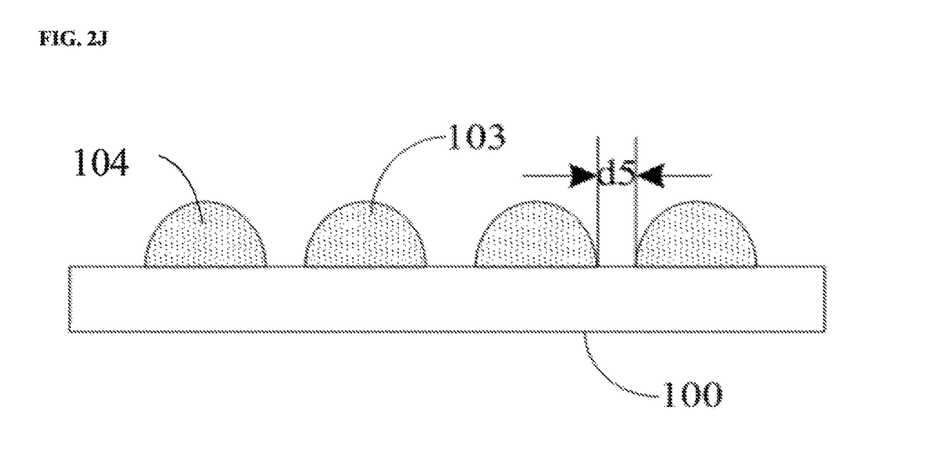

Referring to FIG. 2I and FIG. 2J, the method in some embodiments further includes removing the first ridge 1011a (and optionally, the second ridge 1011b). Optionally, the step of removing the first ridge 1011a includes dissolving the first ridge using a solvent. Various appropriate solvents that selectively dissolve the hydrophobic material (e.g., the first ridges 1011a and the second ridge 1011b) but not other components on the base substrate 100 (e.g., the first electrode 103 and the second electrode 104, other layers in contact with the solvent) may be used in removing the first ridge 1011a. Optionally, the solvent is a fluoro solvent.

Optionally, the method includes soaking the base substrate 100 having the first electrode 103 and the second electrode 104 formed in a solvent (e.g., a fluoro solvent). After the first electrode 103 and the second electrode 104 are dissolved, the base substrate 100 is dried and cleaned, e.g., dried using a nitrogen gas and cleaned using ethanol. As shown in FIG. 2I and FIG. 2J, after the first ridge 1011*a* is removed, a gap is formed between the first electrode 103 and the second electrode 104. Optionally, the gap has a width d5 less than approximately 20 microns, e.g., less than approximately 15 microns, less than approximately 10 microns, less than approximately 5 microns, less than approximately 4 microns, or less than approximately 3 microns.

Optionally, the method further includes forming a third electrode and a fourth electrode on two opposite sides of the second ridge. Optionally, the method further includes removing the second ridge.

Figure 3:
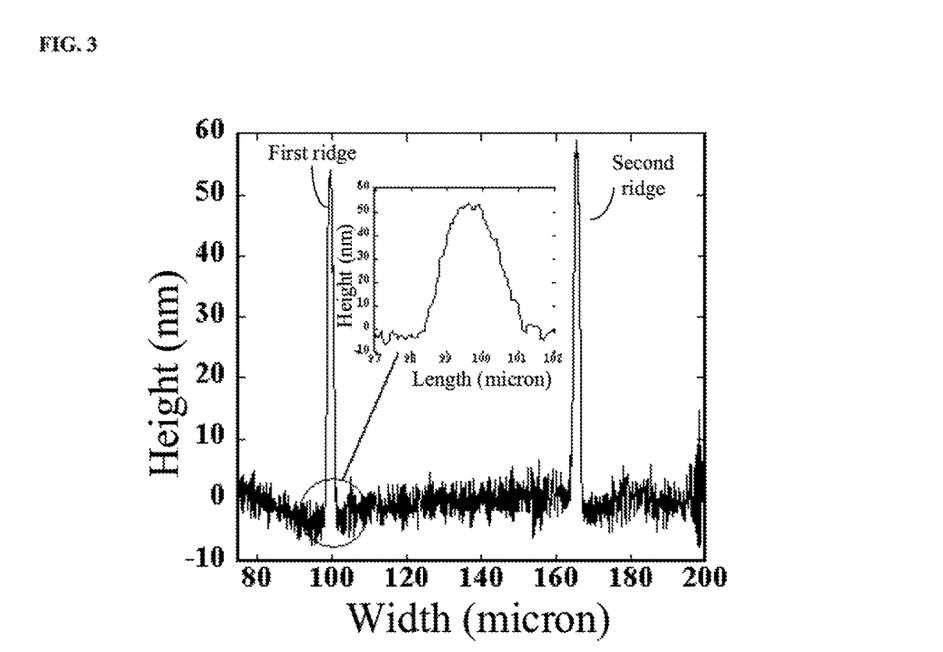
FIG. 3 is a diagram illustrate the height of a hydrophobic pattern across its width direction in some embodiments according to the present disclosure.

FIG. 3 is a diagram illustrate the height of a hydrophobic pattern across its width direction in some embodiments according to the present disclosure. Referring to FIG. 3, the measurement is taken prior to removing the portion of the hydrophobic pattern between the first ridge and the second ridge. The horizontal coordinates represent the width of the hydrophobic pattern from a reference point, the vertical coordinates represent the height of the hydrophobic pattern from a reference point. FIG. 3 demonstrates that the first ridge and the second ridge clearly have a height greater than the region between the first ridge and the second ridge.

Figure 4:
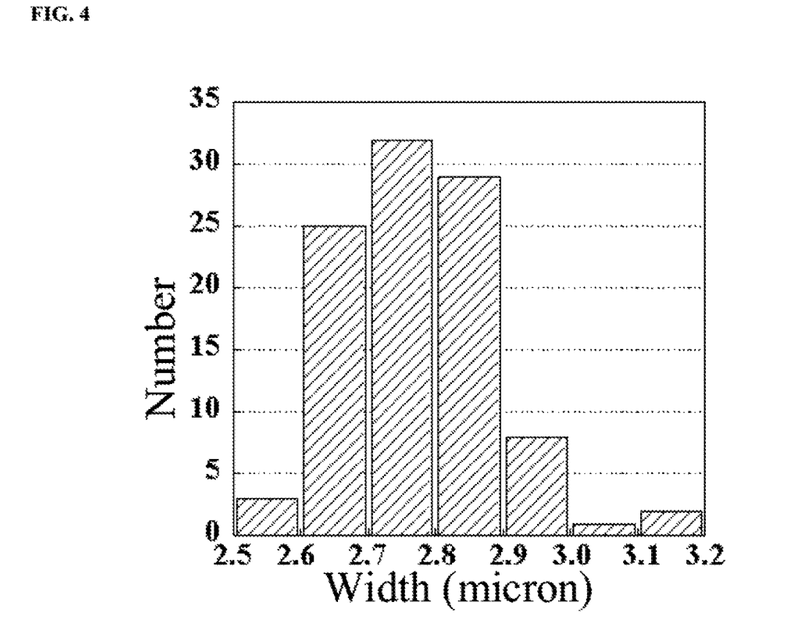
FIG. 4 is a graph illustrating the statistic distribution of the gap distance between the first electrode and the second electrode in some embodiments according to the present disclosure.

FIG. 4 is a graph illustrating the statistic distribution of the gap distance between the first electrode and the second electrode in some embodiments according to the present disclosure. Referring to FIG. 4, the measurement is taken subsequent to removal of the first ridge between the first electrode and the second electrode in a substrate having a plurality of pairs of first electrode and second electrode formed thereon. The horizontal coordinates represent the width of the gap between the first electrode and the second electrode, the vertical coordinates represent a number of samples having a particular gap distance. As illustrated in FIG. 4, a gap distance (channel width) between the first electrode and the second electrode less than 5 microns (and as small as 2.5 micron) can be achieved according to the present method.

In another aspect, present disclosure provides a large-scale fabrication method for forming an array substrate. The method in some embodiments includes forming a hydrophobic material layer having a plurality of hydrophobic sections on a base substrate; each of the plurality of hydrophobic sections is formed to have a first ridge on a first edge, each of the plurality of hydrophobic sections has a thickness at the first ridge greater than that in a region outside a region corresponding to the first ridge; removing a portion of each of the plurality of hydrophobic sections outside the region corresponding to the first ridge; forming a plurality of source electrodes and a plurality of drain electrodes on the base substrate, each pair of one of the plurality of source electrodes one of the plurality of drain electrodes are formed on two opposite sides of the first ridge. Optionally, the hydrophobic material layer having a plurality of hydrophobic sections is formed by ink-jet printing an ink containing the hydrophobic material on the base substrate; and drying the ink containing the hydrophobic material. The first ridge in each of the plurality of hydrophobic sections is formed by a coffee-ring effect in the ink. Optionally, the plurality of source electrodes and the plurality of drain electrodes are formed by ink-jet printing an ink containing a conductive material on the first ridges of the plurality of hydrophobic sections. The ink containing the conductive material de-wets the first ridges, thereby being at least partially repelled to two sides of the first ridges. Optionally, the method further includes removing the first ridges thereby forming a gap between each pair of first electrode and the second electrode. Optionally, each pair of the first electrode and the second electrode separated by the first ridge (or the gap after removal of the first ridge) are a source electrode and a drain electrode of a thin film transistor. The present method thus can be used for fabricating an array substrate having a plurality of thin film transistors.

In another aspect, the present disclosure provides an array substrate fabricated by a method described herein.

In another aspect, the present disclosure provides a method of fabricating a thin transistor. In some embodiments, the method includes forming the first electrode and the second electrode according to a method described herein, the first electrode and the second electrode are respectively a source electrode and a drain electrode of the thin film transistor.

In another aspect, the present disclosure provides a thin film transistor fabricated by a method described herein. Optionally, the thin film transistor is a short-channel thin film transistor having a channel width less than approximately 5 microns, e.g., less than approximately 4 microns or less than approximately 3 microns.

Various types of thin film transistors may be fabricated by the present method. Examples of thin film transistors include a bottom-gate top-contact thin film transistor, a bottom-gate bottom-contact thin film transistor, a top-gate top-contact thin film transistor, and a top-gate bottom-contact thin film transistor. The thin film transistor may be an inorganic semiconductor thin film transistor. Optionally, the thin film transistor fabricated by the present method is an organic semiconductor thin film transistor.

Figure 5:
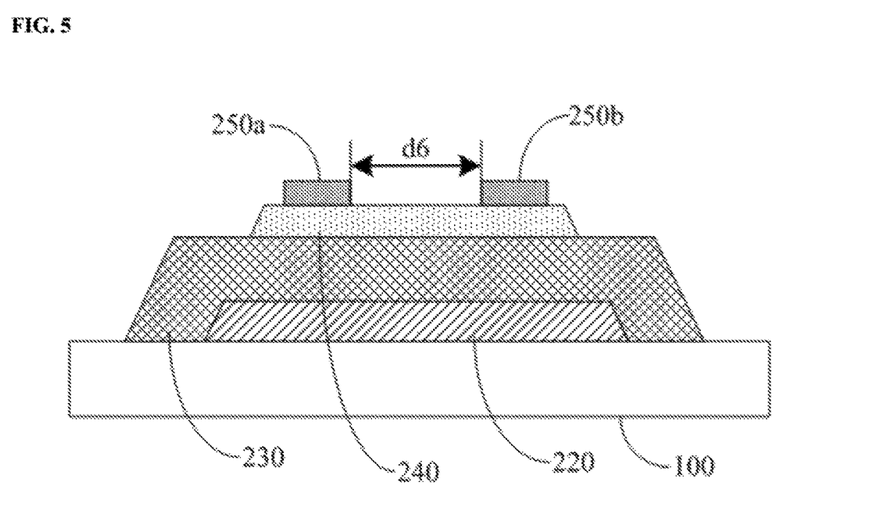
FIG. 5 is a schematic diagram illustrating the structure of a bottom-gate top-contact thin film transistor in some embodiments according to the present disclosure.

FIG. 5 is a schematic diagram illustrating the structure of a bottom-gate top-contact thin film transistor in some embodiments according to the present disclosure. Referring to FIG. 5, the method of fabricating the thin film transistor in some embodiments includes forming a gate electrode 220 on a base substrate 100, forming a gate insulating layer 230 on a side of the gate electrode 220 distal to the base substrate 100, forming an active layer 240 on a side of the gate insulating layer 230 distal to the gate electrode 220, and forming a source electrode 250*a* and a drain electrode 250*b* on a side of the active layer 240 distal to the gate insulating layer 230. Optionally, the active layer 240 is an inorganic active layer.

Various appropriate electrode materials may be used for forming the gate electrode 220. Examples of appropriate electrode materials for forming the gate electrode 220 include a metal, an alloy, and a conductive metal oxide. The gate electrode 220 may be formed on the base substrate 100 by, e.g., sputtering, vapor deposition, solution coating, or ink-jet printing. Various appropriate insulating materials may be used for forming the gate insulating layer 230. Examples of appropriate insulating materials for forming the gate insulating layer 230 include inorganic materials such as silicon oxide and silicon nitride and organic materials such as polymers, and may include a plurality sub-layers laminated together. The gate insulating layer 230 may be formed by, e.g., anodic oxidation, sputtering, solution coating, or printing. Various appropriate semiconductor materials may be used for forming the active layer 240. Examples of appropriate semiconductor materials for forming the active layer 240 include metal oxide semiconductor materials. The active layer 240 may be formed by, e.g., sputtering, solution coating, or printing. The source electrode 250*a* and the drain electrode 250*b* may be formed using a method described in the present disclosure.

In one example, the step of forming the source electrode 250a and the drain electrode 250b includes ink-jet printing an ink containing a perfluoro resin on the base substrate 100 having the active layer 240 formed thereon, to form a hydrophobic pattern containing the perfluoro resin. Due to the coffee-ring effect in the ink, when the ink is dried, the hydrophobic pattern is formed to have a first ridge on a first edge and a second ridge on a second edge opposite to the first edge, the hydrophobic pattern has a thickness at the first ridge and the second ridge greater than that in a region between the first ridge and the second ridge. The hydrophobic pattern is then treated with a plasma for a duration in a range of approximately 3 minutes to approximately 15 minutes, with a power in a range of approximately 30 Watts to approximately 100 Watts. Subsequent to the plasma treatment, the base substrate 100 having the hydrophobic pattern is annealed at a temperature in a range of approximately 80 degrees to approximately 150 degrees for a duration in a range of approximately 5 minutes to approximately 20 minutes. An ink containing a conductive material is then printed on the first ridge. Due to the hydrophobicity of the first ridge, the ink containing the conductive material de-wets the first ridge, thereby being at least partially repelled to two opposite sides of the first ridge. The base substrate 100 having the ink containing the conductive material ink-jet printed on the first ridge is then annealed to dry the ink, thereby forming the source electrode 250 and the drain electrode 250b The base substrate 100 after the annealing step is then soaked in a fluoro solvent to remove the first ridge. The base substrate 100 is then dried using nitrogen and cleaned using ethanol, for multiple times. By removing the first ridge, a gap between the source electrode 250a and the drain electrode 250b is formed. The gap distance d6 is greater than zero and less than 5 microns. The gap between the source electrode 250a and the drain electrode 250b corresponds to the channel region of the active layer 240. The channel region has a channel width less than 5 microns.

Figure 6:
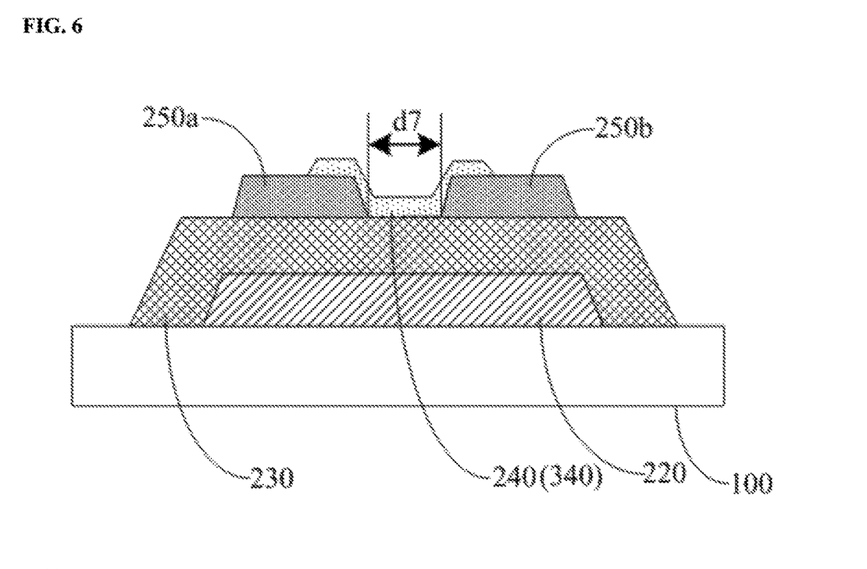
FIG. 6 is a schematic diagram illustrating the structure of a bottom-gate bottom-contact thin film transistor in some embodiments according to the present disclosure.

FIG. 6 is a schematic diagram illustrating the structure of a bottom-gate bottom-contact thin film transistor in some embodiments according to the present disclosure. Referring to FIG. 6, the method of fabricating the thin film transistor in some embodiments includes forming a gate electrode 220 on a base substrate 100, forming a gate insulating layer 230 on a side of the gate electrode 220 distal to the base substrate 100, forming a source electrode 250a and a drain electrode 250b on a side of the gate insulating layer 230 distal to the gate electrode 220, and forming an active layer 240 on a side of the gate insulating layer 230, the source electrode 250a, and the drain electrode 250b distal to the gate electrode 220. Optionally, the active layer 240 is an inorganic active layer.

The source electrode 250a and the drain electrode 250b may be formed using a method described in the present disclosure. In one example, the step of forming the source electrode 250a and the drain electrode 250b includes ink-jet printing an ink containing a perfluoro resin on the gate insulating layer 230, to form a hydrophobic pattern containing the perfluoro resin. Due to the coffee-ring effect in the ink, when the ink is dried, the hydrophobic pattern is formed to have a first ridge on a first edge and a second ridge on a second edge opposite to the first edge, the hydrophobic pattern has a thickness at the first ridge and the second ridge greater than that in a region between the first ridge and the second ridge. The hydrophobic pattern is then treated with a plasma for a duration in a range of approximately 3 minutes to approximately 15 minutes, with a power in a range of approximately 30 Watts to approximately 100 Watts. Subsequent to the plasma treatment, the base substrate 100 having the hydrophobic pattern is annealed at a temperature in a range of approximately 80 degrees to approximately 150 degrees for a duration in a range of approximately 5 minutes to approximately 20 minutes. An ink containing a conductive material is then printed on the first ridge. Due to the hydrophobicity of the first ridge, the ink containing the conductive material de-wets the first ridge, thereby being at least partially repelled to two opposite sides of the first ridge. The base substrate 100 having the ink containing the conductive material ink-jet printed on the first ridge is then annealed to dry the ink, thereby forming the source electrode 250 and the drain electrode 250b. The base substrate 100 after the annealing step is then soaked in a fluoro solvent to remove the first ridge. The base substrate 100 is then dried using nitrogen and cleaned using ethanol, for multiple times. By removing the first ridge, a gap between the source electrode 250a and the drain electrode 250b is formed. The gap distance d7 is greater than zero and less than 5 microns.

Subsequently, the active layer 240 is firmed on a side of the gate insulating layer 230, the source electrode 250a, and the drain electrode 250b distal to the gate electrode 220. The gap between the source electrode 250a and the drain electrode 250b corresponds to the channel region of the active layer 240. The channel region has a channel width less than 5 microns.

Figure 7:
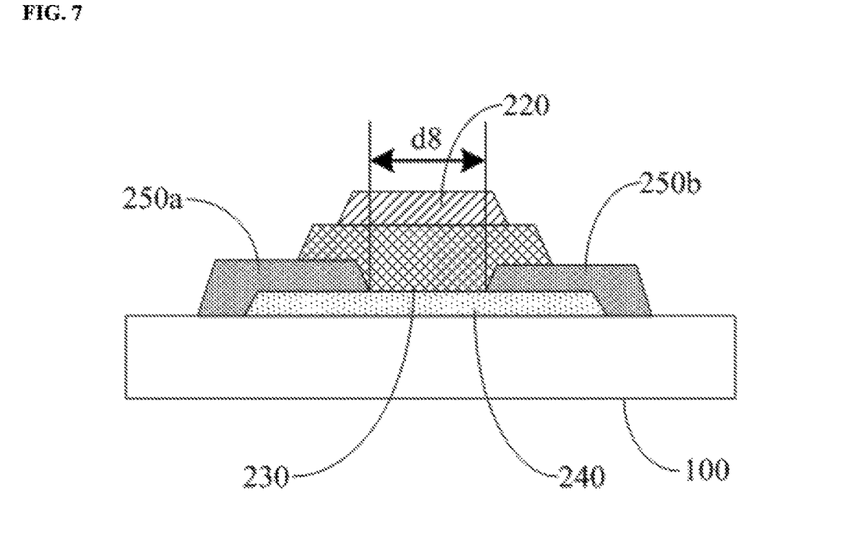
FIG. 7 is a schematic diagram illustrating the structure of a top-gate top-contact thin film transistor in some embodiments according to the present disclosure.

FIG. 7 is a schematic diagram illustrating the structure of a top-gate top-contact thin film transistor in some embodiments according to the present disclosure. Referring to FIG. 7, the method of fabricating the thin film transistor in some embodiments includes forming an active layer 240 on the base substrate 100, and forming a source electrode 250a and a drain electrode 250b on a side of the active layer 240 distal to the base substrate 100, forming a gate insulating layer 230 on a side of the active layer 240, the source electrode 250a, and the drain electrode 250b distal to the base substrate 100, and forming a gate electrode 220 on a side of the gate insulating layer 230 distal to the active layer 240. Optionally, the active layer 240 is an inorganic active layer.

The source electrode 250a and the drain electrode 250b may be formed using a method described in the present disclosure, e.g., the ones described in the context of FIG. 5 and FIG. 6. In the last step of forming the source electrode 250a and the drain electrode 250b, a gap between the source electrode 250a and the drain electrode 250b is formed by removing the first ridge. The gap distance d8 is greater than zero and less than 5 microns. The gap between the source electrode 250a and the drain electrode 250b corresponds to the channel region of the active layer 240. The channel region has a channel width less than 5 microns.

Figure 8:
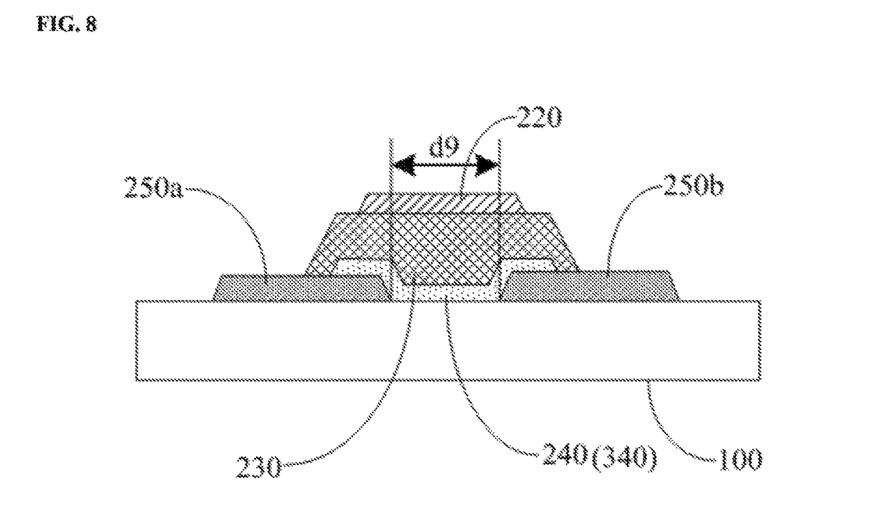
FIG. 8 is a schematic diagram illustrating the structure of a top-gate bottom-contact thin film transistor in some embodiments according to the present disclosure.

FIG. 8 is a schematic diagram illustrating the structure of a top-gate bottom-contact thin film transistor in some embodiments according to the present disclosure. Referring to FIG. 8, the method of fabricating the thin film transistor in some embodiments includes forming a source electrode 250a and a drain electrode 250b on the base substrate 100, and forming an active layer 240 on a side of the source electrode 250a and the drain electrode 250b distal to the base substrate 100, forming a gate insulating layer 230 on a side of the active layer 240, the source electrode 250a, and the drain electrode 250b distal to the base substrate 100, and forming a gate electrode 220 on a side of the gate insulating layer 230 distal to the active layer 240. Optionally, the active layer 240 is an inorganic active layer.

The source electrode 250a and the drain electrode 250b may be formed using a method described in the present disclosure. In one example, the step of forming the source electrode 250a and the drain electrode 250b includes ink-jet printing an ink containing a perfluoro resin on the base substrate 100, to form a hydrophobic pattern containing the perfluoro resin. Due to the coffee-ring effect in the ink, when the ink is dried, the hydrophobic pattern is formed to have a first ridge on a first edge and a second ridge on a second edge opposite to the first edge, the hydrophobic pattern has a thickness at the first ridge and the second ridge greater than that in a region between the first ridge and the second ridge. The hydrophobic pattern is then treated with a plasma for a duration in a range of approximately 3 minutes to approximately 15 minutes, with a power in a range of approximately 30 Watts to approximately 100 Watts. Subsequent to the plasma treatment, the base substrate 100 having the hydrophobic pattern is annealed at a temperature in a range of approximately 80 degrees to approximately 150 degrees for a duration in a range of approximately 5 minutes to approximately 20 minutes. An ink containing a conductive material is then printed on the first ridge. Due to the hydrophobicity of the first ridge, the ink containing the conductive material de-wets the first ridge, thereby being at least partially repelled to two opposite sides of the first ridge. The base substrate 100 having the ink containing the conductive material ink-jet printed on the first ridge is then annealed to dry the ink, thereby forming the source electrode 250 and the drain electrode 250*b*. The base substrate 100 after the annealing step is then soaked in a fluoro solvent to remove the first ridge. The base substrate 100 is then dried using nitrogen and cleaned using ethanol, for multiple times. By removing the first ridge, a gap between the source electrode 250*a* and the drain electrode 250*b* is formed. The gap distance d9 is greater than zero and less than 5 microns. The gap distance d8 is greater than zero and less than 5 microns. The gap between the source electrode 250*a* and the drain electrode 250*b* corresponds to the channel region of the active layer 240. The channel region has a channel width less than 5 microns.

In some embodiments, the thin film transistor fabricated by the present method is a thin film transistor having an active layer made of an organic semiconductor material. Referring to FIG. 6, the method of fabricating the thin film transistor having an active layer made of an organic semiconductor material in some embodiments includes forming a gate electrode 220 on a base substrate 100, forming a gate insulating layer 230 on a side of the gate electrode 220 distal to the base substrate 100, forming a source electrode 250*a* and a drain electrode 250*b* on a side of the gate insulating layer 230 distal to the gate electrode 220, and forming an active layer 240 on a side of the gate insulating layer 230, the source electrode 250*a*, and the drain electrode 250*b* distal to the gate electrode 220. The active layer 240 is made of an organic semiconductor material. Various appropriate organic semiconductor materials may be used for forming the active layer 240. Examples of appropriate organic semiconductor materials for forming the active layer 240 include organic polymer semiconductor materials, organic small molecule semiconductor materials, graphene, and carbon nanotubes. The active layer 240 may be formed by, e.g., vapor deposition, solution coating, or printing.

Referring to FIG. 8, the method of fabricating the thin film transistor having an active layer made of an organic semiconductor material in some embodiments includes forming a source electrode 250*a* and a drain electrode 250*b* on the base substrate 100, and forming an active layer 240 on a side of the source electrode 250*a* and the drain electrode 250*b* distal to the base substrate 100, forming a gate insulating layer 230 on a side of the active layer 240, the source electrode 250*a*, and the drain electrode 250*b* distal to the base substrate 100, and forming a gate electrode 220 on a side of the gate insulating layer 230 distal to the active layer 240. The active layer 240 is made of an organic semiconductor material.

As compared to conventional thin film transistors, the thin film transistor and the fabricating method according to the present disclosure has many advantages. First, by first forming the hydrophobic first ridge (e.g., by the coffee-ring effect) and forming the first electrode and the second electrode by de-wetting the hydrophobic first ridge using an ink containing the conductive material, the electrodes may be formed without a lithography process such as a photolithography process, an ion beam lithography process, or an electron beam lithography process. The fabrication costs can be significantly lowered. Second, a large-scale electrode fabrication process is made possible by the present method. For example, an array of electrodes may be fabricated on a substrate by the present method. Third, a substantially uniform distribution of widths of the first ridges (equivalent to a channel width of the thin film transistor) can be achieved in the present thin film transistor. For example, by adjusting parameters of the ink-jet printing process, the contents of the conductive material ink, parameters of the drying process, and so on, the uniformity of the width distribution of the first ridges can be precisely controlled. For example, an array substrate having a plurality of thin film transistors having a uniform distribution of channel widths of approximately 5 microns can be made using the present method. Fourth, the present method is suitable fib making organic or inorganic thin film transistors. Moreover, the thin film transistors in the array substrate may be fabricated much faster and more efficiently as compared to the conventional methods, with the components highly integrated in the array substrate.

In another aspect, the present disclosure provides a display apparatus having a thin film transistor described herein or fabricated by a method described herein, or having an array substrate described herein or fabricated by a method described herein. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a plurality of electrodes, comprising:
    forming a hydrophobic pattern comprising a hydrophobic material on a base substrate, the hydrophobic pattern has a first ridge on a first edge of the hydrophobic pattern, the hydrophobic pattern has a thickness at the first ridge greater than that in a region outside a region corresponding to the first ridge;
    removing a portion of the hydrophobic pattern outside the region corresponding to the first ridge; and
    forming a first electrode on a first side of the first ridge and a second electrode on a second side of the first ridge;
    wherein removing the portion of the hydrophobic pattern outside the region corresponding to the first ridge comprises:
    treating the hydrophobic pattern with a plasma; and
    subsequent to treating the hydrophobic pattern with the plasma, annealing the base substrate having the hydrophobic pattern.

2. The method of claim 1, wherein forming the hydrophobic pattern on the base substrate comprises:
    ink-jet printing an ink comprising the hydrophobic material on the base substrate; and
    drying the ink comprising the hydrophobic material;
    wherein the hydrophobic pattern having the first ridge is formed by a coffee-ring effect.

3. The method of claim 1, wherein forming the first electrode and the second electrode comprises:
    ink-jet printing an ink comprising a conductive material on the first ridge;
    wherein the ink comprising the conductive material de-wets the first ridge, thereby being at least partially repelled to two sides of the first ridge.

4. The method of claim 3, further comprising annealing the base substrate having the ink comprising the conductive material ink-jet printed, thereby drying the ink comprising the conductive material.

5. The method of claim 1, wherein
    the hydrophobic pattern has a plurality of ridges including the first ridge on the first edge of the hydrophobic pattern and a second ridge on a second edge of the hydrophobic pattern opposite to the first edge;
    removing the portion of the hydrophobic pattern outside the region corresponding to the first ridge comprises removing a portion of the hydrophobic pattern between the first ridge and the second ridge;
    the method further comprises:
    forming a third electrode on a first side of the second ridge and a fourth electrode on a second side of the second ridge; and
    removing the second ridge.

6. The method of claim 1, wherein the plasma comprises oxygen.

7. The method of claim 1, wherein treating the hydrophobic pattern with the plasma is performed for a duration in a range of approximately 3 minutes to approximately 15 minutes, with a power in a range of approximately 30 Watts to approximately 100 Watts.

8. The method of claim 1, wherein annealing the base substrate having the hydrophobic pattern is performed at a temperature in a range of approximately 80 degrees to approximately 150 degrees for a duration in a range of approximately 5 minutes to approximately 20 minutes.

9. The method of claim 1, further comprising removing the first ridge.

10. The method of claim 9, wherein removing the first ridge comprises dissolving the first ridge using a solvent.

11. The method of claim 1, wherein, subsequent to removing the portion of the hydrophobic pattern outside the region corresponding to the first ridge:
    the first ridge has a width greater than zero and less than approximately 10 microns.

12. The method of claim 1, wherein, prior to removing the portion of the hydrophobic pattern outside the region corresponding to the first ridge, the hydrophobic pattern has a width greater than approximately 10 microns, and the first ridge has a height greater than approximately 10 nm; and
    subsequent to removing the portion of the hydrophobic pattern outside the region corresponding to the first ridge, the first ridge has a height greater than 5 nm.

13. The method of claim 1, wherein the hydrophobic material comprises a perfluoro resin.

14. A method of fabricating a thin film transistor, comprising:
    forming the first electrode and the second electrode according to the method of claim 1, the first electrode and the second electrode are respectively a source electrode and a drain electrode of the thin film transistor.

15. A thin film transistor, fabricated by the method of claim 14.

16. A display apparatus, comprising the thin film transistor of claim 15.

17. A method of fabricating a plurality of electrodes, comprising:
    forming a hydrophobic pattern comprising a hydrophobic material on a base substrate, the hydrophobic pattern has a first ridge on a first edge of the hydrophobic pattern, the hydrophobic pattern has a thickness at the first ridge greater than that in a region outside a region corresponding to the first ridge;
    removing a portion of the hydrophobic pattern outside the region corresponding to the first ridge; and
    forming a first electrode on a first side of the first ridge and a second electrode on a second side of the first ridge;
    wherein the hydrophobic pattern has a plurality of ridges including the first ridge on the first edge of the hydrophobic pattern and a second ridge on a second edge of the hydrophobic pattern opposite to the first edge;
    removing the portion of the hydrophobic pattern outside the region corresponding to the first ridge comprises removing a portion of the hydrophobic pattern between the first ridge and the second ridge;
    the method further comprises:
    forming a third electrode on a first side of the second ridge and a fourth electrode on a second side of the second ridge; and
    removing the second ridge.

18. A method of fabricating an array substrate, comprising:
    forming a hydrophobic material layer comprising a plurality of hydrophobic sections on a base substrate; each of the plurality of hydrophobic sections is formed to have a first ridge on a first edge, each of the plurality of hydrophobic sections has a thickness at the first ridge greater than that in a region outside a region corresponding to the first ridge;

removing a portion of each of the plurality of hydrophobic sections outside a region corresponding to the first ridge; and forming a plurality of source electrodes and a plurality of drain electrodes on the base substrate, each pair of one of the plurality of source electrodes one of the plurality of drain electrodes are formed on two opposite sides of the first ridge;

wherein removing the portion of each of the plurality of hydrophobic sections outside the region corresponding to the first ridge comprises:

treating the hydrophobic pattern with a plasma; and subsequent to treating the hydrophobic pattern with the plasma, annealing the base substrate having the hydrophobic pattern.

19. An array substrate, fabricated by the method of claim 18.

20. A display apparatus, comprising the array substrate of claim 19.

* * * * *